(12) United States Patent
Zhang et al.

(10) Patent No.: US 12,430,061 B2
(45) Date of Patent: Sep. 30, 2025

(54) HARDWARE-BASED MEMORY COMPRESSION

(71) Applicant: Microsoft Technology Licensing, LLC, Redmond, WA (US)

(72) Inventors: Lintao Zhang, Beijing (CN); John G. Bennett, Sammamish, WA (US); Bojie Li, Haidian (CN)

(73) Assignee: Microsoft Technology Licensing, LLC, Redmond, WA (US)

( * ) Notice: Subject to any disclaimer, the term of this patent is extended or adjusted under 35 U.S.C. 154(b) by 77 days.

(21) Appl. No.: 17/617,519

(22) PCT Filed: Jul. 2, 2019

(86) PCT No.: PCT/CN2019/094419
§ 371 (c)(1),
(2) Date: Dec. 8, 2021

(87) PCT Pub. No.: WO2021/000263
PCT Pub. Date: Jan. 7, 2021

(65) Prior Publication Data
US 2022/0253236 A1    Aug. 11, 2022

(51) Int. Cl.
*G06F 3/06*    (2006.01)
(52) U.S. Cl.
CPC .......... *G06F 3/0655* (2013.01); *G06F 3/0604* (2013.01); *G06F 3/0679* (2013.01)
(58) Field of Classification Search
CPC .............................. G06F 3/0655; G06F 3/0604

(Continued)

(56) References Cited

U.S. PATENT DOCUMENTS

| 8,473,673 B2 | 6/2013 | Gaither et al. |
| 8,478,731 B1 | 7/2013 | Throop et al. |

(Continued)

FOREIGN PATENT DOCUMENTS

| CN | 1425986 A | 6/2003 |
| CN | 101923511 A | 12/2010 |

(Continued)

OTHER PUBLICATIONS

"Flexible Memory: A Novel Main Memory Architecture with Block-level Memory Compression", 2015 IEEE International Conference on Networking, Architecture and Storage (NAS) by Yanan Cao, Long Chen, & Zhao Zhang (2015), pp. 285-294, URL: https://ieeexplore.ieee.org/stamp/stamp.jsp?tp=&arnumber=7255237 (Year: 2015).*

(Continued)

*Primary Examiner* — Titus Wong
(74) *Attorney, Agent, or Firm* — Schwegman Lundberg & Woessner, P.A.

(57) ABSTRACT

A compressed memory is divided into a plurality of segments, each segment is divided into a plurality of sub-segments, and each sub-segment in an uncompressed data space is compressed into block (s) in a compressed data space. Upon a read request to a sub-segment in a segment in compressed memory is received, the corresponding entry is firstly determined based on a first level address mapping between the sub-segment and the entry, and then the corresponding block (s) is determined based on a second level address mapping between the entry and the block (s). By use of two-level address mappings, the size of entry can be reduced, thereby achieving low metadata overhead. Moreover, the proposed data layout for compressed memory.

12 Claims, 4 Drawing Sheets

(58) Field of Classification Search
USPC .......................................................... 711/154
See application file for complete search history.

(56) References Cited

U.S. PATENT DOCUMENTS

| | | | |
|---|---|---|---|
| 9,304,898 B2 | 4/2016 | Solihin | |
| 2011/0107052 A1* | 5/2011 | Narayanasamy | ..... G06F 3/0608 |
| | | | 711/170 |
| 2011/0179225 A1* | 7/2011 | Flynn | ................... H05K 7/1487 |
| | | | 711/E12.001 |
| 2011/0185112 A1* | 7/2011 | Goss | ................... G06F 12/0246 |
| | | | 711/E12.001 |
| 2011/0219186 A1* | 9/2011 | Amit | ............... G11B 20/00007 |
| | | | 711/117 |
| 2014/0006745 A1 | 1/2014 | Fontenot et al. | |
| 2014/0189281 A1 | 7/2014 | Sokol et al. | |
| 2014/0244603 A1* | 8/2014 | Arges | .................... G06F 12/023 |
| | | | 707/693 |
| 2014/0244962 A1* | 8/2014 | Arges | .................... G06F 12/023 |
| | | | 711/171 |
| 2015/0095299 A1* | 4/2015 | Dickie | .................. G06F 16/164 |
| | | | 707/700 |
| 2015/0199377 A1* | 7/2015 | Peters | ............. H04N 21/23116 |
| | | | 707/770 |
| 2015/0339228 A1 | 11/2015 | Heddes et al. | |
| 2016/0077744 A1* | 3/2016 | Pundir | .................. G06F 3/0608 |
| | | | 711/103 |
| 2016/0371190 A1* | 12/2016 | Romanovskiy | ....... G06F 3/0659 |
| 2017/0004069 A1 | 1/2017 | Li | |
| 2017/0230485 A1* | 8/2017 | Sulieman | ............ G06F 16/1727 |
| 2017/0285955 A1 | 10/2017 | Carter | |
| 2017/0344578 A1 | 11/2017 | Constantinescu et al. | |
| 2018/0329830 A1 | 11/2018 | Senior | |

FOREIGN PATENT DOCUMENTS

| | | |
|---|---|---|
| CN | 103902467 A | 7/2014 |
| CN | 104375956 A | 2/2015 |
| CN | 107250991 A | 10/2017 |
| CN | 107436848 A | 12/2017 |
| JP | H0844498 A | 2/1996 |
| JP | 2000227874 A | 8/2000 |
| JP | 2007264692 A | 10/2007 |
| JP | 2011128792 A | 6/2011 |
| JP | 2015036981 A | 2/2015 |
| JP | 2017516232 A | 6/2017 |
| JP | 2017537384 A | 12/2017 |
| JP | 2018156137 A | 10/2018 |

OTHER PUBLICATIONS

"International Search Report and Written Opinion Issued in PCT Application No. PCT/CN19/094419", Mailed Date: Apr. 1, 2020, 10 Pages.
Pekhimenko, et al., "Base-Delta-Immediate Compression: Practical Data Compression for On-Chip Caches", In Proceedings of the 21st international conference on Parallel architectures and compilation techniques, Sep. 19, 2012, pp. 377-388.
Pekhimenko, et al., "Linearly Compressed Pages: A Low-Complexity, Low-Latency Main Memory Compression Framework", In Proceedings of the 46th Annual IEEE/ACM International Symposium on Microarchitecture, Dec. 7, 2013, pp. 172-184.
Pekhimenko, et al., "Linearly Compressed Pages: A Main Memory Compression Framework with Low Complexity and Low Latency", In Proceedings of 21st International Conference on Parallel Architectures and Compilation Techniques, Sep. 19, 2012, 01 Page.
Sardashti, et al., "Could Compression Be of General Use? Evaluating Memory Compression across Domains", In Journal of ACM Transactions on Architecture and Code Optimization (TACO) vol. 14, Issue 4, Dec. 5, 2017, 24 Pages.
Tremaine, et al., "IBM Memory Expansion Technology (MXT)", In IBM Journal of Research and Development vol. 45, Issue 2, Mar. 2, 2001, pp. 271-285.
Tuduce, et al., "Adaptive Main Memory Compression", In Proceedings of the USENIX Annual Technical Conference, Apr. 10, 2005, pp. 237-250.
Young, et al., "CRAM: Efficient Hardware-Based Memory Compression for Bandwidth Enhancement", In Repository of arXiv:1807.07685v1, Jul. 20, 2018, 13 Pages.
Zhao, et al., "Buri: Scaling Big-Memory Computing with Hardware-Based Memory Expansion", In Journal of ACM Transactions on Architecture and Code Optimization (TACO) vol. 12, Issue 3, Oct. 6, 2015, 24 Pages.
"Search Report Issued in European Patent Application No. 19936545.3", Mailed Date: Dec. 15, 2022, 11 Pages.
Cao, et al., "Flexible memory: A novel main memory architecture with block-level memory compression", In Proceedings of IEEE International Conference on Networking, Architecture and Storage (NAS), Aug. 6, 2015, pp. 285-294.
"Office Action Issued in Japanese Patent Application No. 2021-576807", Mailed Date: Oct. 11, 2023, 5 Pages.
Examination Report Received for India Application No. 202117058433, mailed on Sep. 22, 2023, 9 pages.
Notice of Reasons for Rejection for Japanese Application No. 2024-019288, mailed on Feb. 20, 2025, 7 pages (English Translation Provided).
First Office Action Received for Chinese Application No. 201980098081.4, mailed on Jan. 7, 2025, 22 Pages (English Translation Provided).
Notice of Reason for Rejection for Japanese Application No. 2021-576807, mailed on May 1, 2023, 15 Pages (English Translation Provided).
Office Action for Japanese Application No. 2021-576807, mailed on Jan. 16, 2024, 3 Pages.
Communication pursuant to Rules 70(2) and 70a(2) EPC and reference to Rule 39(1) EPC received for EP Application No. 19936545.3, mailed on Jan. 11, 2023, 1 Page.
Intimation of Grant for Indian Application No. 202117058433, mailed on Jan. 24, 2025, 1 page.
Office Action Received for Korean Application No. 1020217043056, mailed on Jan. 24, 2025, 14 pages. (English Translation Provided).
Office Action Received for Canada Application No. 3142618, mailed on May 30, 2025, 06 Pages.

* cited by examiner

HARDWARE-BASED MEMORY COMPRESSION

CROSS-REFERENCE TO RELATED APPLICATION

This application is a U.S. National Stage Filing under 35 U.S.C. 371 of International Patent Application Serial No. PCT/CN2019/094419, filed Jul. 2, 2019, and published as WO 2021/000263 A1 on Jan. 7, 2021, which application and publication are incorporated herein by reference in their entirety.

BACKGROUND

A memory refers to a component of the computing device that stores information for immediate use in a computing system, and the memory is also called as a primary storage. The memory, such as random access memory (RAM), operates at a high speed, as a distinction from storage that provides slow-to-access information but offers higher capacities. Generally, there are two main kinds of memories, such as volatile memory and non-volatile memory, and examples of volatile memory include dynamic random access memory (DRAM), static random access memory (SRAM), and the like.

A memory compression is a memory management technology that utilizes data compression to reduce the size of data stored in the memory, which may include software-based memory compression and hardware-based memory compression. Software-based memory compression is already used in operating systems, in which compression and decompression processes are generally implemented by the processor or the processing unit. Instead, hardware-based memory compression is implemented through hardware, and the compression and decompression processes may be processed by the hardware component.

SUMMARY

In embodiments of the present disclosure, there is provided an approach for hardware-based memory compression. A compressed memory according to embodiments of the present disclosure is divided into a plurality of segments, each segment is divided into a plurality of sub-segments, and each sub-segment in an uncompressed data space is compressed into one or more blocks in a compressed data space. Upon a read request to a sub-segment in a segment in compressed memory is received, the corresponding entry is firstly determined based on a first level address mapping between the sub-segment and the entry, and then the corresponding block(s) is determined based on a second level address mapping between the entry and the block(s). According to embodiments of the present disclosure, by use of two-level address mappings, the size of entry can be reduced, thereby achieving a low metadata overhead. Moreover, the proposed data layout for compressed memory can achieve stably fast block allocation in compressed memory.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The above and other features, advantages and aspects of embodiments of the present disclosure will be made more apparent by describing the present disclosure in more detail with reference to drawings. In the drawings, the same or like reference signs represent the same or like elements, wherein.

DETAILED DESCRIPTION

Figure 1:
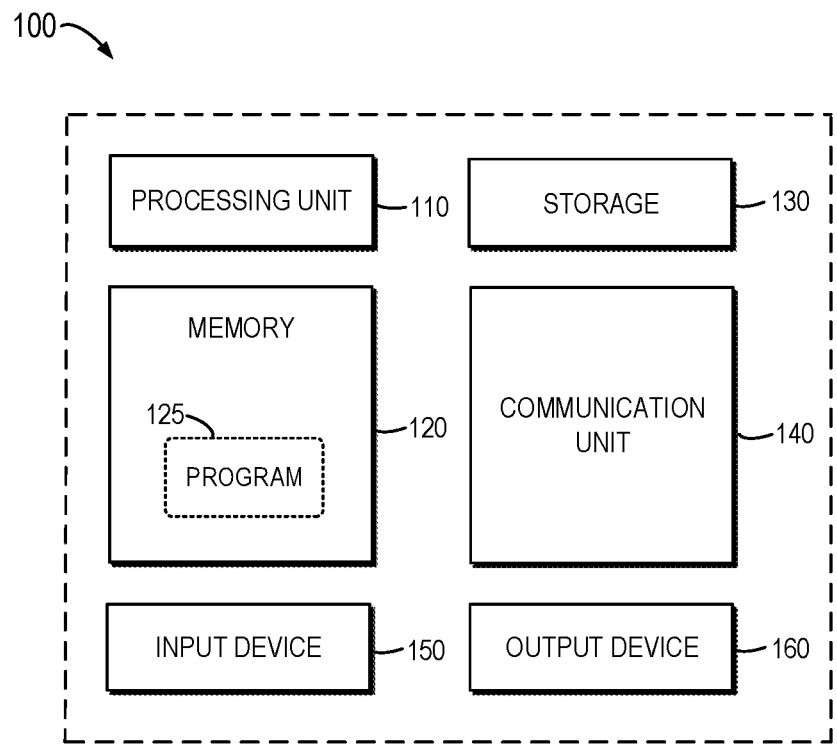
FIG. 1 illustrates a block diagram of a computing device/server in which one or more embodiments of the present disclosure may be implemented.

Embodiments of the present disclosure will be described in more detail below with reference to figures. Although the drawings show some embodiments of the present disclosure, it should be appreciated that the present disclosure may be implemented in many forms and the present disclosure should not be understood as being limited to embodiments illustrated herein. On the contrary, these embodiments are provided herein to enable more thorough and complete understanding of the present disclosure. It should be appreciated that drawing and embodiments of the present disclosure are only used for exemplary purposes and not used to limit the protection scope of the present disclosure.

As used herein, the term "includes" and its variants are to be read as open terms that mean "includes, but is not limited to." The term "based on" is to be read as "based at least in part on." The term "an embodiment" is to be read as "at least one embodiment." The term "another embodiment" is to be read as "at least one other embodiment." The term "some embodiments" is to be read as "at least some embodiments." Definitions of other terms will be given in the text below.

Generally, memory consumes a large portion of hardware cost of a computing device such as a computer or a server. For example, DRAM may consume up to 40% or even higher hardware cost of the cloud servers, and thus memory compression may be used to reduce the memory cost or further scale-up the servers. The memory compression technologies mainly comprise software-based memory compression and hardware-based memory compression. Software-based memory compression is implemented through software, and it consumes a lot of processor resources and results in too much latency, which causes significant slowdown of the operating system and/or applications. Traditional hardware-based memory compression has a poor data layout and a poor block allocation mechanism that causes high metadata overhead and internal fragmentation, resulting in a low utilization of the compressed memory. Thus, traditional ways for memory compression may cause system slowdown or high metadata overhead.

To this end, a new approach for hardware-based memory compression is proposed. In embodiments of the present disclosure, a compressed memory is divided into a plurality of segments, each segment is divided into a plurality of sub-segments, and each sub-segment in an uncompressed data space is compressed into block(s) in a compressed data space. Upon a read request to a sub-segment in a segment in compressed memory is received, the corresponding entry is firstly determined based on a first level address mapping between the sub-segment and the entry, and then the corresponding block(s) is determined based on a second level address mapping between the entry and the block(s).

According to embodiments of the present disclosure, by use of two-level address mappings, the size of entry can be reduced, thereby achieving a low metadata overhead. Moreover, the proposed data layout for compressed memory according to embodiments of the present disclosure can enable stably fast block allocation in compressed memory. Furthermore, since embodiments of the present disclosure use hardware-based memory compression, the system and application slowdown can be avoided, as compared with the software-based memory compression.

In addition, in some embodiments of the present disclosure, by enlarging the size of each sub-segment (which is a compression unit in the compressed memory), the compression ratio for memory compression can be increased, thereby further increasing the utilization of the memory. Embodiments of the present disclosure may configure a plurality of pointers in each entry, the storage unit of the memory (that is the block size) can be small, and thus internal fragmentation can be reduced. Other advantages of embodiments of the present disclosure will be described with reference to the example implementation as below. Reference is made below to FIG. 1 through FIG. 8 to illustrate basic principles and several example embodiments of the present disclosure herein.

FIG. 1 illustrates a block diagram of a computing device/server 100 in which one or more embodiments of the present disclosure may be implemented. It would be appreciated that the computing device/server 100 described in FIG. 1 is merely for illustration but not limit the function and scope of embodiments of the present disclosure in any manners. The computing device/server 100 may be a computer or a server.

As shown in FIG. 1, the computing device/server 100 is in the form of a general-purpose computing device. Components of the computing device/server 100 may include, but are not limited to, one or more processor(s) or processing unit(s) 110, a memory 120, a storage device 130, one or more communication unit(s) 140, one or more input device(s) 150, and one or more output device(s) 160. The processing unit 110 may be a physical or virtual processor and perform various processes based on programs stored in the memory 120. In a multiprocessor system, a plurality of processing units may execute computer executable instructions in parallel to improve parallel processing capability of the computing device/server 100.

The computing device/server 100 typically includes various computer storage media. The computer storage media may be any media accessible by the computing device/server 100, including but not limited to volatile and non-volatile media, or removable and non-removable media. The memory 120 can be a volatile memory (for example, a register, cache, Random Access Memory (RAM)), non-volatile memory (for example, a Read-Only Memory (ROM), Electrically Erasable Programmable Read-Only Memory (EEPROM), flash memory), or any combination thereof.

As shown in FIG. 1, the memory 120 may include a program 125 for implementing memory compression and block allocation according to embodiments of the present disclosure, which may have one or more sets of program modules configured to execute methods and functions of various embodiments described herein. In some embodiments, the memory 120 may include a traditional regular memory (such as an uncompressed memory) and a proposed compressed memory according to embodiments of the present disclosure, the compressed memory may have a new data layout and a block allocation mechanism, which may be used for storing compressed data that may be accessed infrequently or less frequently.

The storage device 130 can be any removable or non-removable media and may include machine-readable media such as a flash drive, disk, and any other media, which can be used for storing information and/or data and accessed within the computing device/server 100. For example, the storage device 130 may be a hard disc drive (HDD) or a solid state drive (SSD).

The computing device/server 100 may further include additional removable/non-removable or volatile/non-volatile storage media. Although not shown in FIG. 1, a magnetic disk drive is provided for reading and writing from/to a removable and non-volatile disk (e.g., "a floppy disk") and an optical disk drive may be provided for reading or writing from/to a removable non-volatile optical disk. In such cases, each drive is connected to the bus (not shown) via one or more data media interfaces.

The communication unit 140 communicates with another computing device via communication media. Additionally, functions of components in the computing device/server 100 may be implemented in a single computing cluster or a plurality of computing machines that are communicated with each other via communication connections. Therefore, the computing device/server 100 can be operated in a networking environment using a logical connection to one or more other servers, network personal computers (PCs), or another network node.

The input device 150 can include one or more input devices such as a mouse, keyboard, tracking ball and the like. The output device 160 can include one or more output devices such as a display, loudspeaker, printer, and the like. The computing device/server 100 can further communicate, via the communication unit 140, with one or more external devices (not shown) such as a storage device or a display device, one or more devices that enable users to interact with the computing device/server 100, or any devices that enable the computing device/server 100 to communicate with one or more other computing devices (for example, a network card, modem, and the like). Such communication can be performed via input/output (I/O) interfaces (not shown). Next, reference is made below to FIGS. 2-8 to specify example embodiments of the present disclosure.

Figure 2:
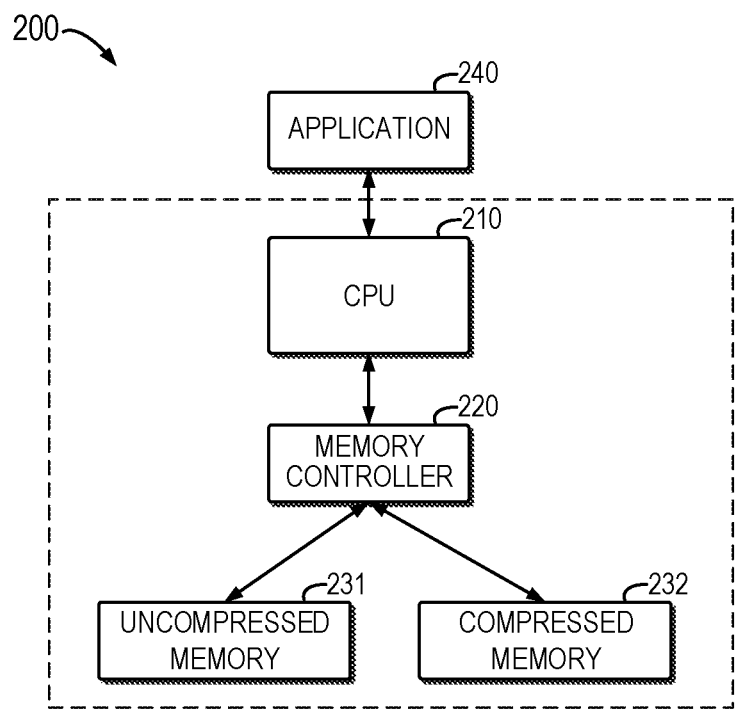
FIG. 2 illustrates an example architecture with a tile-based compressed memory according to embodiments of the present disclosure.

FIG. 2 illustrates an example architecture 200 with a tile-based compressed memory according to embodiments of the present disclosure. As shown in FIG. 2, the architecture 200 comprises a CPU 210, a memory controller 220, an uncompressed memory 231, a compressed memory 232 and a software application 240. CPU 210 may be a processing unit for executing program instructions, such as the processing unit 110 as shown in FIG. 1. The memory controller 220 is a digital circuit that manages the flow of data going to and from the uncompressed memory 231 and compressed memory 232. The memory controller may be a separate chip or integrated into another chip, such as being placed on the same die or as an integral part of CPU 210. The memory controller may manage read and write operations with the memory, along with keeping the memory active by supplying the memory with electric current.

The uncompressed memory 231 is a regular memory, such as a traditional DRAM, and the uncompressed memory 231 may be used for storing frequently accessed data, because frequently accessed data is accessed frequently and is not suitable for compression. The compressed memory 232 is a new proposed memory according to embodiments of the present disclosure, and it may be used for storing less frequently accessed data so as to increase the amount of data that may be stored in the memory. The software application 240 comprises one or more programs that may include applications, libraries, drivers, operating systems, hypervisors and/or other components. One or more programs in the software application 240 may distinguish frequently accessed data and infrequently accessed data, and may control which data should be stored in uncompressed memory 231 and which data should be stored in the compressed memory 232. In embodiments of the present disclosure, the uncompressed memory 231 and the compressed memory 232 may share a same address space accessible from the CPU 210.

In some embodiments, the compression and decompression operations for data may implemented in the compressed memory 232, in this case, embodiments of the present disclosure may be implemented as a new design for data layout and block allocation in the memory module. Alternatively, the compression and decompression operations for the compressed memory 232 may be implemented in the memory controller 220.

According to the example architecture 200, the CPU 210 may transmit data to the uncompressed memory 231 or the compressed memory 232 via the memory controller 220 based on a determination of the software application 240. Embodiments of the present disclosure propose a new data layout and block allocation algorithm for the compressed memory 232, which can reduce the metadata overhead for compressed memory and achieve fast block allocation in the compressed memory.

Figure 3:
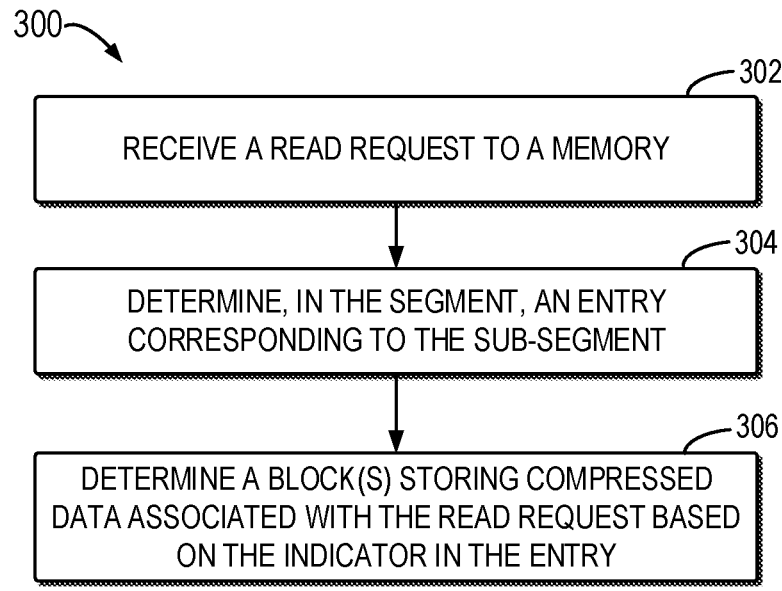
FIG. 3 illustrates a flow chart of a method for hardware-based memory compression according to embodiments of the present disclosure.

FIG. 3 illustrates a flow chart of a method 300 for hardware-based memory compression according to embodiments of the present disclosure. It should be appreciated that the method 300 may be executed by the memory 120 of the computing device/server 100 as described with reference to FIG. 1, or the compressed memory 232 or the memory controller 220 as described with reference to FIG. 2.

At 302, a read request to a memory is received, and the read request is related to a sub-segment of a segment in the memory. In embodiments of the present disclosure herein, a compressed memory is divided into a plurality of segments, and each segment may have a first predefined size (such as 32 KiB) and may be called as a "tile," where the memory for example may have a capacity of 4 GiB. Assume that the compression ratio of the compressed memory is 2:1, the 4 GiB compressed memory can store 8 GiB of uncompressed data.

In embodiments of the present disclosure herein, each segment is divided into a plurality of sub-segments, and each sub-segment may have a second predefined size (such as 512 bytes) and may be called as a "paragraph." Each sub-segment in an uncompressed data space is compressed into block(s) in a compressed data space, and each block may have a third predefined size (such as 64 bytes). It should be understood that, although example sizes of memory, tile, paragraph and block are described in some embodiments, other sizes may be also possible, depending on the manual configuration of the developer and/or administrator. The tile is a fixed-sized, self-contained data structure composed of root entries, blocks, and bitmap. It should be understood that although embodiments of the present disclosure use the terms "tile" and "paragraph" to represent the concepts "a segment" and "a sub-segment," but other terms or words may be also possible to represent the concepts "a segment" and "a sub-segment."

At 304, an entry in the segment corresponding to the sub-segment is determined, and the entry comprises an indicator (such as one or more pointers). In some embodiments of the present disclosure, the entry may be located in the root of the tile, as part of the self-contained data structure of the tile, and the entry may be also called as a "root entry." For example, the corresponding root entry is firstly determined based on a first level address mapping between the paragraph and the entry. In some embodiments, the first level address mapping may be a fixed mapping rule, and the mapping rule may comprise static mappings between the paragraphs and the root entries within the tile. The corresponding root entry may be located within a specific tile to be accessed once the paragraph is known. In this way, storage overhead for root entries can be reduced in contrast to dynamic mappings. In some embodiments, the fixed mapping rule may be configured in an interleaved way. For example, the last bits of a paragraph address are used as an index of the root entry such that successive paragraphs are widely distributed. In this way, the overflow event in the tile may be reduced or handled better. Alternatively, the fixed mapping rule may be a linear mapping (for example, successive paragraphs have similar compression rations) or a randomized mapping (such as CRC32 algorithm).

At 306, one or more blocks storing compressed data associated with the read request are determined based on the indicator in the entry. For example, the corresponding block(s) may be determined based on a second level address mapping between the root entry and the block(s). The second level address mapping may be a dynamic mapping rule comprising dynamic mappings between the root entry and the block(s). In this way, fast block allocation can be achieved. According to the method 300 of the present disclosure, by use of two-level address mappings, the size of entry can be reduced, thereby achieving a low metadata overhead and saving memory space. In addition, since the compressed memory can store more data than uncompressed memory due to the compression, embodiments of the present disclosure can reduce memory cost and/or scale-up memory capacity.

In some embodiments, if the determined root entry comprises two or more pointers, two or more corresponding blocks will be determined, and the compressed data may be read from the two or more blocks in parallel. In this way, data blocks can be fetched in parallel, thereby increasing the reading speed for the compressed memory. That is, after reading the root entry, the second level of blocks can be determined, and a plurality of block reads may be issued in parallel to reduce latency.

Moreover, since one root entry may comprise a plurality of pointers, a plurality of blocks can be determined from one entry. That is, one paragraph may be compressed into many numbers of blocks, for example, one block, two blocks, four blocks, eight blocks, and the like. In this way, by enabling the paragraph size larger than block size, multiple blocks may be configured to store the compressed data compressed from one paragraph, and thus the internal fragmentation can be reduced.

Figure 4:
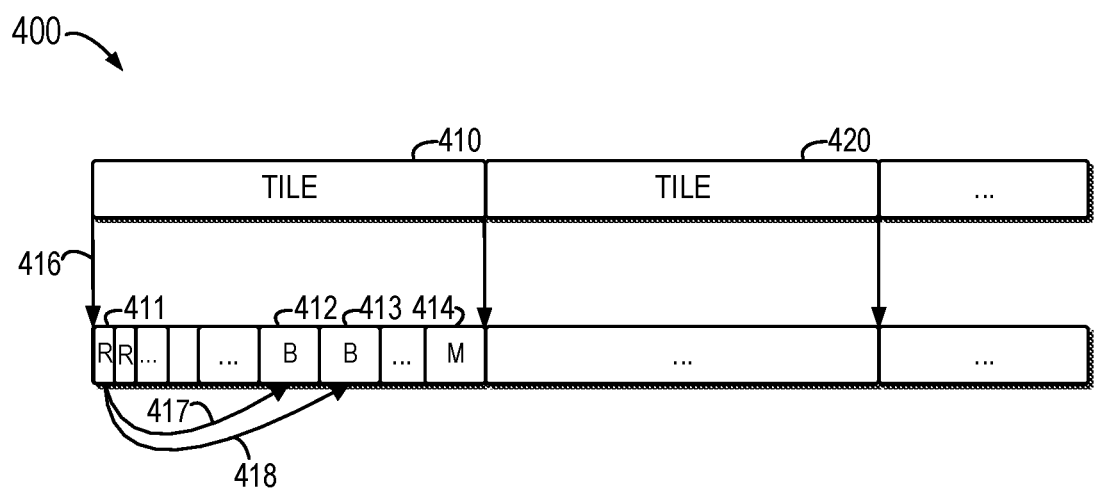
FIG. 4 illustrates a schematic diagram for two-level address mappings for a tile according to embodiments of the present disclosure.

FIG. 4 illustrates a schematic diagram 400 for two-level address mapping for a tile according to embodiments of the present disclosure. As shown in FIG. 4, the compressed memory comprises a plurality of tiles, such as tile 410, 420 and the like, and the address mapping from a paragraph in a tile to blocks is implemented through the two-level address mappings, in which the root entries are used as an indirection for the two-level address mappings.

Referring to FIG. 4, the tile 410 may comprise a plurality of root entries (such as root entry 411), a plurality of blocks (such as blocks 412, 413) and a bitmap (such as bitmap 414), the root entries are used to locate the corresponding blocks, the blocks are used to store compressed data, and the bitmap is used to indicate the allocation status of blocks in the tile 410. For example, each bit in the bitmap 414 may indicate whether each block in the tile 410 is allocated. In the example of FIG. 4, firstly, one paragraph in the tile is mapped to a root entry (such as root entry 411) based on a fixed mapping, as indicated by arrow 416, where each paragraph corresponds to one root entry, and the root entry 411 comprises one or more pointers for finding the corresponding blocks. Secondly, the root entry 411 is mapped to blocks 412 and 413 based on a dynamic mapping, as indicated by the arrows 417 and 418. By restricting the dynamic mapping to a tile, allocation of blocks in the compressed memory can be stably fast.

In some embodiments, the maximum number of pointers in the root entry 411 may be determined based on a first ratio between a paragraph size and a block size, while the size of each pointer in the root entry 411 may be determined based on a second ratio between a tile size and a block size. For example, in the above example in which each tile has a size of 32 KiB, each paragraph has a size of 512 bytes and each block has a size of 64 bytes, the size of each root entry is 8*9 bits, that is 9 bytes, where 8 represents the maximum number of pointers in one root entry, and 9 bits represent the size of each pointer. In this way, the root entry according to embodiments of the present disclosure, that is the metadata, occupies only a small portion of memory space, thereby saving the metadata overhead in the compressed memory.

Figure 5:
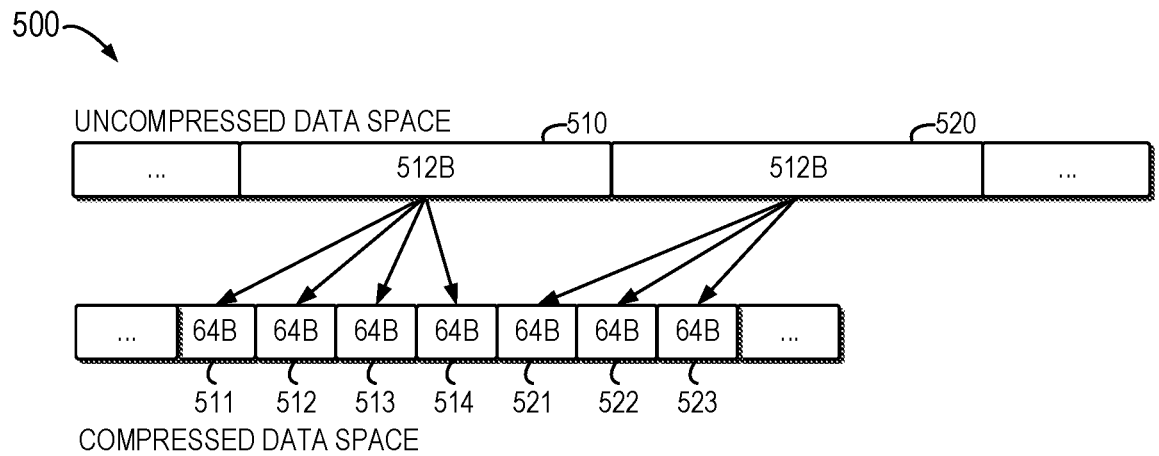
FIG. 5 illustrates a schematic diagram for an example data compression from a paragraph to one or more blocks according to embodiments of the present disclosure.

FIG. 5 illustrates a schematic diagram 500 for an example data compression from a paragraph to one or more blocks according to embodiments of the present disclosure. In embodiments of the present disclosure, the unit of memory allocation is a tile with a size for example 32 KiB, the unit of compression in an uncompressed data space is a paragraph with a size for example 512 bytes, and the unit of memory access in a compressed data space is a block with a size for example 64 bytes. In this example, the size of one paragraph is preset to be for example eight times that of one block. In this way, by enlarging the size of each paragraph, the compression ratio for memory compression can be increased, because a larger compression unit generally has a larger compression ratio than a smaller compression unit.

Referring to FIG. 5, each tile may be divided into a plurality of paragraphs, such as paragraphs 510 and 520, and the paragraph may be the data object viewed by processor and applications. As shown in FIG. 5, the paragraph 510 in the uncompressed data space may be compressed into four blocks in the compressed data space, such as blocks 511, 512, 513 and 514, while the paragraph 520 in the uncompressed data space may be compressed into three blocks in the compressed data space, such as blocks 521, 522 and 523. As shown in FIG. 5, different data may have different compression ratios, depending on the type of data and actual contents in the data. In other words, the actual amount of blocks depends on the compression ratio of an individual paragraph.

Figure 6:
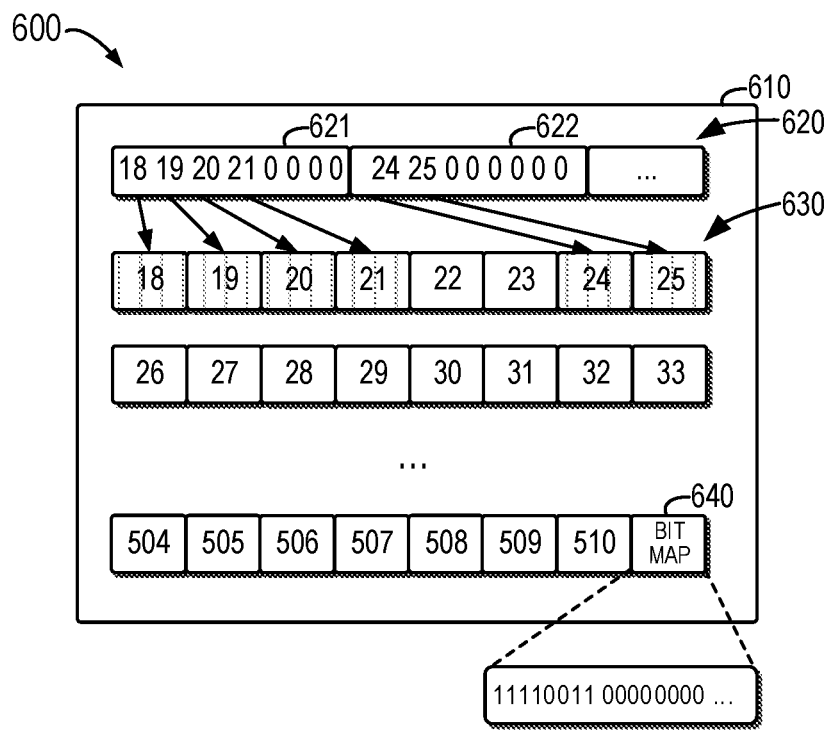
FIG. 6 illustrates an example data layout in a tile according to embodiments of the present disclosure.

FIG. 6 illustrates an example data layout 600 in a tile 610 according to embodiments of the present disclosure. As shown, the tile 610 comprises a plurality of root entries 620 (such as root entries 621 and 622), a plurality of data blocks 630 and a bitmap 640. In the example data layout 600, the tile 610 may have a size of for example 32 KiB, each paragraph has a size of 512 bytes and each block has a size of 64 bytes.

In the above example, the tile 610 has 512 blocks in total. Assume that the compression ratio is preset to be 2:1, the tile 610 may have 128 paragraphs and 128 root entries. Each root entry may comprise up to 8 pointers, and each pointer has a size of 9 bits. Thus, each paragraph may correspond to one root entry having a size up to 9 bytes, 128 paragraphs will occupy 128*9 bytes of memory space (corresponding to 18 blocks), and each paragraph may be compressed into up to 8 blocks. The bitmap 640 is used for controlling the allocation of blocks in the compressed memory, 512 blocks in the tile 610 will need 512 bits, corresponding to 1 block. Accordingly, the tile 610 have 18 blocks for storing root entries and 1 block for storing bitmap, which totally occupies 19 blocks for storing metadata, and thus 493 blocks will be remaining for storing compressed data, such as blocks with IDs "18"-"510" in FIG. 6. In this way, the utilization of the memory can be increased.

Referring to FIG. 6, the bitmap 640 indicates that some blocks are allocated while other blocks are not allocated, where bit "1" represents the corresponding block has been allocated. If a write request to the tile 610 is received, bitmap 640 will be checked first to allocate one or more blocks for storing the compressed data, then, the corresponding root entry will be written with IDs of the allocated blocks, and the bitmap 640 will also be modified. If a read request to a paragraph in the tile 610 is received, the corresponding root entry (such as root entry 621) will be determined first based on the first level fixed mapping, and the related blocks (such as blocks with IDs "18," "19," "20" and "21") will then be determined based on the second level dynamic mapping. In this way, the blocks can be allocated and identified in a fast way, thereby improving the storage efficient for compressed memory.

Figure 7:
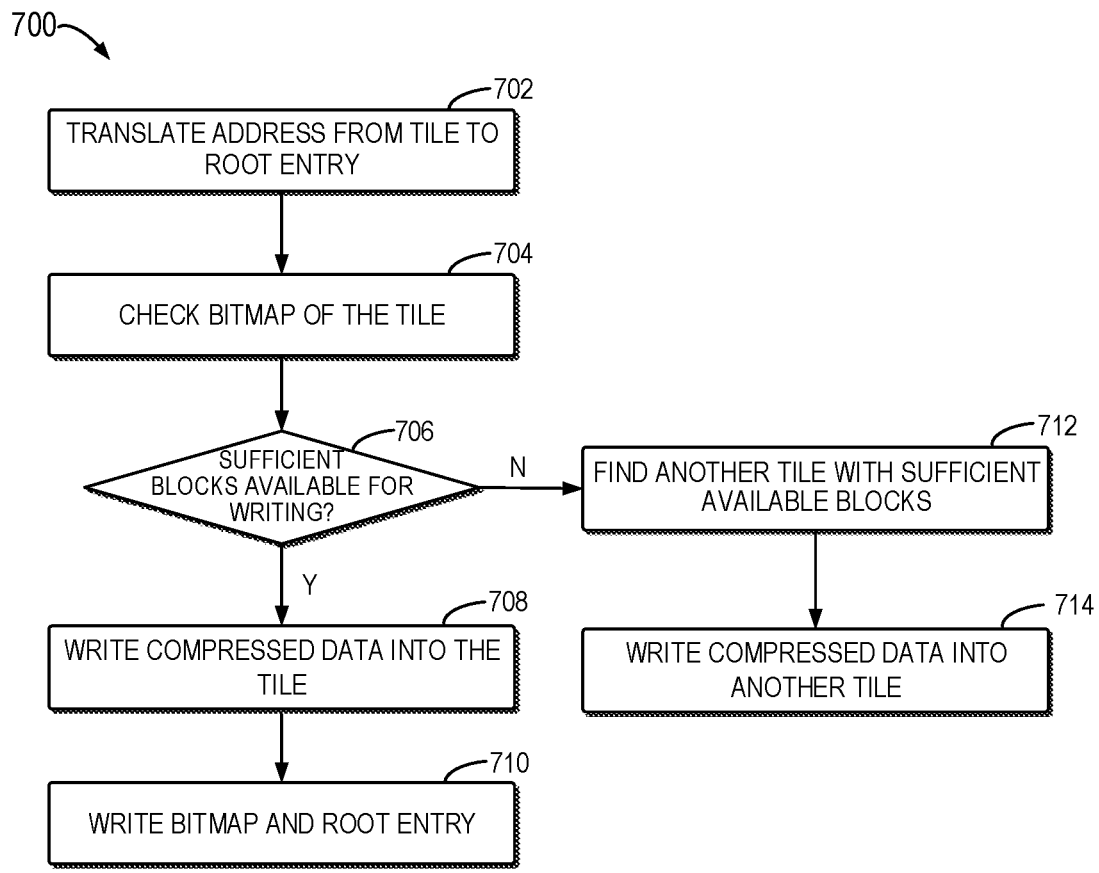
FIG. 7 illustrates a flow chart of a method for writing compressed data into a tile according to embodiments of the present disclosure.

FIG. 7 illustrates a flow chart of a method 700 for writing compressed data according to embodiments of the present disclosure. As compared with the processing of a read request to a tile as in method 300 of FIG. 3, the method 700 describes a processing method of a write request to a memory. It should be appreciated that the method 700 may be executed by the memory 120 of the computing device/server 100 as described with reference to FIG. 1, or the compressed memory 232 or the memory controller 220 as described with reference to FIG. 2.

At 702, upon a write request to a memory in the compressed memory is received, address translation is performed from a tile to root entry. For example, an address translator may calculate the root entry address in compressed memory space from a physical address in uncompressed memory space.

At 704, the bitmap of the tile is checked, and each bit in the bitmap indicates whether each block in the tile is allocated. At 706, according to the bitmap, it is determined whether sufficient blocks in the tile are available for the write request. If the bitmap indicates that sufficient blocks in the tile are available for the write request, at 708, compressed data associated with the write request is written into one or more blocks in the tile based on the bitmap. Then, at 710, the bitmap and root entry are also written or updated, and the compressed data is stored in the compressed memory successfully.

If the bitmap indicates that insufficient blocks in the tile are available for the write request, at 708, another tile in the memory needs to be found, which has sufficient available blocks for the write request. In this case, it means that the blocks in this tile have been consumed and an overflow event occurs. Then, at 714, at least a part of compressed data associated with the write request is written into the block(s) in another tile. In this way, the overflow event can be handled correctly, avoiding data loss in the compressed memory. In some embodiments, a special value (for example 511) in a regular root entry may be used to represent an overflow root entry, and the special value is followed by a pointer, referencing another block in an overflow tile. The block in the overflow tile may be used as a root entry to reference compressed data blocks in the overflow tile. In some embodiments, another special value (for example 0) may be used to indicate an empty root entry, which means the paragraph is unallocated or all bits of the memory content are zero.

Figure 8:
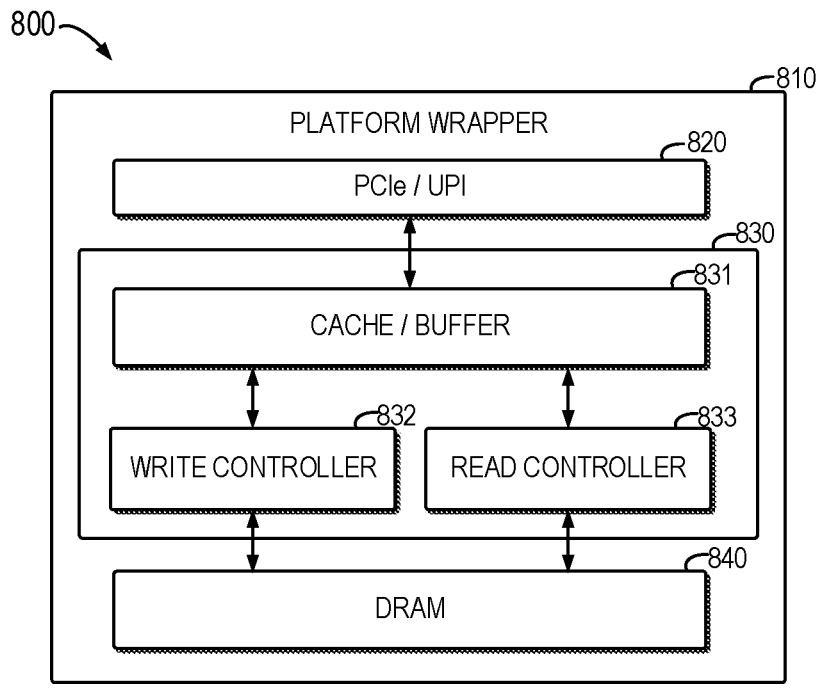
FIG. 8 illustrates an example hardware architecture for implementing memory compression according to embodiments of the present disclosure.

FIG. 8 illustrates an example hardware architecture 800 for implementing memory compression according to embodiments of the present disclosure. FIG. 8 shows an example of the present disclosure that may be implemented in a memory controller, however, embodiments of the present disclose may also be implemented in a compressed memory. The example hardware architecture 800 may be an Field-Programmable Gate Arrays (FPGA) board that attaches to the host via a Peripheral Component Interconnect Express (PCIe) bus. The hypervisor maps the PCIe Memory-mapped I/O (MMIO) space of the FPGA to the software, so the CPU can access the compressed memory directly. In addition, CPU may also access the uncompressed memory directly.

As shown in FIG. 8, the example hardware architecture 800 comprises platform wrapper 810, PCIe/UPI 820, memory controller 830 which includes cache/buffer 831, write controller 832, and read controller 833, and DRAM 840. The memory controller 830 may control data from or to DRAM 840, and may communicate with the platform wrapper 810 via the PCIe/UPI 820. The wrapper 810 may be used to read the root entry and compressed data in blocks during a read request, and wrapper 810 may be used to read the bitmap during a write request.

The cache/buffer 831 stores paragraphs that are being read/written or recently accessed, and it may have two purposes. First, the cache/buffer 831 finds conflicting read/write operations on a same paragraph, and queues them in a per-paragraph FIFO, so the operations can be executed in order. The cache/buffer 831 only issues independent read/write operations to the remaining part of the memory controller 830, so it can avoid the inconsistency caused by concurrent operations. Second, the cache/buffer 831 caches recently accessed paragraphs to mitigate the access amplification problem. Because the CPU access granularity (cache line size or instruction word size) is typically smaller than the paragraph size, the CPU will issue multiple read/write operations when it scans the paragraph sequentially. By use of the cache, the compressed blocks of the paragraph do not need to be loaded from DRAM and decompressed multiple times, thereby reducing the overhead.

The read controller 833 receives a read request from the cache/buffer 831, and calculates the root entry address in compressed memory space from the address in read request. Then, the read controller 833 accesses the root entry, and determines the block offsets in the tile and calculates the block addresses in compressed memory space. Then, it accesses the blocks and feeds the data to the decompression engine, and the decompressed data is stored in the cache/buffer 831 and sent to the CPU.

The write controller 832 receives a write request from the cache/buffer 831, and calculates the root entry address in compressed memory space from the address in write request. Then, the write controller 832 accesses the root entry and the bitmap, determines the block offsets in the tile, and calculates the block addresses in compressed memory space. The write controller 832 modifies the data according to the write request, then feeds the data to the compression engine. After compression, depending on the change in compressed data size, one or more blocks are allocated or deallocated from the block allocator. Finally, the compressed data is written to the blocks in the tile.

The compression engine may perform compression and decompression of data. To speedup parallel requests, it may have multiple compression engines internally which run in parallel. According to embodiments of the present disclosure, the order of parallel requests is not important, because conflicting operations have been filtered by the cache/buffer 831.

The block allocator may manage the bitmap in each tile. To speedup allocation, the block allocator maintains a bitmap cache internally to cache bitmaps of recently accessed tiles and several tiles with a large number of available blocks. For deallocation, the corresponding bits may be set to zero. For allocation, it first loads the bitmap of the corresponding tile. If there are sufficient available blocks, the corresponding bits are set. Otherwise, it checks the bitmap cache to find an overflow tile with sufficient available blocks. If such a tile could not be found, it scans the bitmap in a number of tiles, and reports allocation failure if an overflow tile could not be found.

The functionally described herein can be performed, at least in part, by one or more hardware logic components. For example, and without limitation, illustrative types of hardware logic components that can be used include Field-Programmable Gate Arrays (FPGAs), Application-specific Integrated Circuits (ASICs), Application-specific Standard Products (ASSPs), System-on-a-chip systems (SOCs), Complex Programmable Logic Devices (CPLDs), and the like.

Program code for carrying out methods of the present disclosure may be written in any combination of one or more programming languages. These program codes may be provided to a processor or controller of a general purpose computer, special purpose computer, or other programmable data processing apparatus, such that the program codes, when executed by the processor or controller, cause the functions/operations specified in the flowcharts and/or block diagrams to be implemented. The program code may execute entirely on a machine, partly on the machine, as a stand-alone software package, partly on the machine and partly on a remote machine or entirely on the remote machine or server.

In the context of this disclosure, a machine readable medium may be any tangible medium that may contain, or store a program for use by or in connection with an instruction execution system, apparatus, or device. The machine readable medium may be a machine readable signal medium or a machine readable storage medium. A machine readable medium may include but not limited to an electronic, magnetic, optical, electromagnetic, infrared, or semiconductor system, apparatus, or device, or any suitable combination of the foregoing. More specific examples of the machine readable storage medium would include an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, while several specific implementation details are contained in the above discussions, these should not be construed as limitations on the scope of the present disclosure, but rather as descriptions of features that may be specific to particular embodiments. Certain features that are described in the context of separate embodiments may also be implemented in combination in a single implementation. Conversely, various features that are described in the context of a single implementation may also be implemented in multiple embodiments separately or in any suitable subcombination.

Some example embodiments of the present disclosure are listed below.

In one aspect, there is provided a method for memory compression. The method comprises: receiving a read request to a memory, wherein the memory is divided into a plurality of segments, one of the plurality of segments is divided into a plurality of sub-segments, and one of the plurality of sub-segments is compressed into one or more blocks, the read request is related to a sub-segment of a segment in the memory; determining, in the segment, an entry corresponding to the sub-segment, wherein the entry comprises an indicator; and determining a block storing compressed data associated with the read request based on the indicator in the entry.

In some embodiments, wherein the determining, in the segment, an entry corresponding to the sub-segment comprises: determining the entry corresponding to the sub-segment based on a mapping rule, wherein the mapping rule comprises static mappings within the segment between sub-segments and entries.

In some embodiments, wherein a size of one sub-segment is preset to be at least eight times that of one block.

In some embodiments, wherein the determining a block storing compressed data associated with the read request based on the indicator in the entry comprises: determining two or more blocks associated with the read request based on two or more pointers in the entry, wherein the maximum number of pointers in the entry is determined based on a first ratio between a size of one sub-segment and a size of one block, and a size of one pointer in the entry is determined based on a second ratio between a size of one segment and a size of one block.

In some embodiments, the method may further comprise: in response to determining two or more blocks associated with the read request, reading the compressed data from the two or more blocks in parallel; and decompressing the compressed data to generate decompressed data.

In some embodiments, the method may further comprise: receiving a write request to the memory; in response to receiving the write request, checking a bitmap in a segment, wherein the segment comprises a plurality of entries, a plurality of blocks and the bitmap, and each bit in the bitmap indicates whether each block in the segment is allocated; in response to the bitmap indicating that sufficient blocks in the segment are available for the write request, writing compressed data associated with the write request into one or more blocks in the segment based on the bitmap; and updating the bitmap and one or more entries in the segment.

In some embodiments, the method may further comprise: in response to the bitmap indicating that insufficient blocks in the segment are available for the write request, determining a further segment in the memory with sufficient available blocks; and writing at least a part of compressed data associated with the write request into a block in the further segment.

In some embodiments, wherein infrequently accessed data is migrated to a compressed memory, while frequently accessed data is migrated to an uncompressed memory, and the uncompressed memory and the compressed memory share a same address space accessible from a processor.

In some embodiments, wherein the method is implemented in the memory, and the read request to the sub-segment of the segment in the memory is received via a memory controller.

In another aspect, there is provided a memory. The memory comprises a memory chip and a controller configured to perform acts. The acts comprise: receiving a read request to the memory, wherein the memory is divided into a plurality of segments, one of the plurality of segments is divided into a plurality of sub-segments, and one of the plurality of sub-segments is compressed into one or more blocks, the read request is related to a sub-segment of a segment in the memory; determining, in the segment, an entry corresponding to the sub-segment, the entry comprising an indicator; and determining a block storing compressed data associated with the read request based on the indicator in the entry.

In some embodiments, wherein the determining an entry in the segment corresponding to the sub-segment comprises: determining the entry corresponding to the sub-segment based on a mapping rule, wherein the mapping rule comprises static mappings within the segment between sub-segments and entries.

In some embodiments, wherein a size of one sub-segment is preset to be at least eight times that of one block.

In some embodiments, wherein the determining a block storing compressed data associated with the read request based on the indicator in the entry comprises: determining two or more blocks associated with the read request based on two or more pointers in the entry, wherein the maximum number of pointers in the entry is determined based on a first ratio between a size of one sub-segment and a size of one block, and a size of one pointer in the entry is determined based on a second ratio between a size of one segment and a size of one block.

In some embodiments, the acts may further comprise: in response to determining two or more blocks associated with the read request, reading the compressed data from the two or more blocks in parallel; and decompressing the compressed data to generate decompressed data.

In some embodiments, the acts may further comprise: receiving a write request to the memory; in response to receiving the write request, checking a bitmap in a segment, wherein the segment comprises a plurality of entries, a plurality of blocks and the bitmap, and each bit in the bitmap indicates whether each block in the segment is allocated; in response to the bitmap indicating that sufficient blocks in the segment are available for the write request, writing compressed data associated with the write request into one or more blocks in the segment based on the bitmap; and updating the bitmap and one or more entries in the segment.

In some embodiments, the acts may further comprise: in response to the bitmap indicating that insufficient blocks in the segment are available for the write request, determining a further segment in the memory with sufficient available blocks; and writing at least a part of compressed data associated with the write request into a block in the further segment.

In some embodiments, wherein infrequently accessed data is migrated to a compressed memory, while frequently accessed data is migrated to an uncompressed memory, and the uncompressed memory and the compressed memory share a same address space accessible from a processor.

In a further aspect, there is provided a program product. The program product comprises executable instructions, the executable instructions, when executed on a device, cause the device to perform acts. The acts comprise: receiving a read request to a memory, wherein the memory is divided into a plurality of segments, one of the plurality of segments is divided into a plurality of sub-segments, and one of the plurality of sub-segments is compressed into one or more blocks, the read request is related to a sub-segment of a segment in the memory; determining, in the segment, an entry corresponding to the sub-segment, the entry comprising an indicator; and determining a block storing compressed data associated with the read request based on the indicator in the entry.

In some embodiments, wherein the determining, in the segment, an entry corresponding to the sub-segment comprises: determining the entry corresponding to the sub-segment based on a mapping rule, wherein the mapping rule comprises static mappings within the segment between sub-segments and entries.

In some embodiments, wherein a size of one sub-segment is preset to be at least eight times that of one block.

In some embodiments, wherein the determining a block storing compressed data associated with the read request based on the indicator in the entry comprises: determining two or more blocks associated with the read request based on two or more pointers in the entry, wherein the maximum number of pointers in the entry is determined based on a first ratio between a size of one sub-segment and a size of one block, and a size of one pointer in the entry is determined based on a second ratio between a size of one segment and a size of one block.

In some embodiments, the acts may further comprise: in response to determining two or more blocks associated with the read request, reading the compressed data from the two or more blocks in parallel; and decompressing the compressed data to generate decompressed data.

In some embodiments, the acts may further comprise: receiving a write request to the memory; in response to receiving the write request, checking a bitmap in the segment, wherein the segment comprises a plurality of entries, a plurality of blocks and the bitmap, and each bit in the bitmap indicates whether each block in the segment is allocated; in response to the bitmap indicating that sufficient blocks in the segment are available for the write request, writing compressed data associated with the write request into one or more blocks in the segment based on the bitmap; and updating the bitmap and one or more entries in the segment.

In some embodiments, the acts may further comprise: in response to the bitmap indicating that insufficient blocks in the segment are available for the write request, determining a further segment in the memory with sufficient available blocks; and writing at least a part of compressed data associated with the write request into a block in the further segment.

In some embodiments, wherein infrequently accessed data is migrated to a compressed memory, while frequently accessed data is migrated to an uncompressed memory, and the uncompressed memory and the compressed memory share a same address space accessible from a processor.

Although the present disclosure has been described in language specific to structural features and/or methodological acts, it is to be understood that the subject matter specified in the appended claims is not necessarily limited to the specific features or acts described above. Rather, the specific features and acts described above are disclosed as example forms of implementing the claims.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments.

What is claimed is:

1. A method for memory compression by a memory device having a memory controller, the method comprising:
   receiving, at the memory controller and from a central processing unit (CPU), a read request for reading data from a memory, the memory being divided into a plurality of segments, one of the plurality of segments being divided into a plurality of sub-segments, one of the plurality of sub-segments being compressed into one or more blocks, and the read request is for reading data from a sub-segment of a segment in the memory;
   determining, in the segment, an entry corresponding to the sub-segment based on an interleaved mapping rule that uses last bits of a paragraph address as an index of the entry to ensure successive paragraphs are widely distributed, the entry comprising an indicator;
   determining a block storing compressed data that contains the requested data identified in the read request based on the indicator in the entry, wherein the indicator comprises a plurality of pointers, and wherein a maximum number of pointers in the entry is determined based on a first ratio between a size of one sub-segment and a size of one block, and a size of one pointer in the entry is determined based on a second ratio between a size of one segment and a size of one block; and
   accessing the determined block to retrieve the compressed data, decompressing the compressed data, and providing the decompressed data to the CPU in response to the read request.

2. The method according to claim 1, wherein the determining, in the segment, an entry corresponding to the sub-segment comprises:
   determining the entry corresponding to the sub-segment based on a mapping rule, the mapping rule comprising static mappings within the segment between sub-segments and entries.

3. The method according to claim 1, wherein a size of one sub-segment is preset to be at least eight times that of one block.

4. The method according to claim 1, wherein the determining a block storing compressed data contains the requested data identified in the read request based on the indicator in the entry comprises:

determining two or more blocks storing compressed data contain the requested data identified in the read request based on two or more pointers in the entry, the maximum number of pointers in the entry being determined based on a first ratio between a size of one sub-segment and a size of one block, and a size of one pointer in the entry being determined based on a second ratio between a size of one segment and a size of one block.

5. The method according to claim 4, further comprising:

in response to determining two or more blocks storing compressed data contain the requested data identified in the read request, reading the compressed data from the two or more blocks in parallel; and decompressing the compressed data to generate decompressed data.

6. The method according to claim 1, further comprising:

receiving a write request to the memory;

in response to receiving the write request, checking a bitmap in a segment, the segment comprising a plurality of entries, a plurality of blocks and the bitmap, and each bit in the bitmap indicating whether each block in the segment is allocated;

in response to the bitmap indicating that sufficient blocks in the segment are available for the write request, writing compressed data specified in the write request into one or more blocks in the segment based on the bitmap; and updating the bitmap and one or more entries in the segment.

7. The method according to claim 6, further comprising:

in response to the bitmap indicating that insufficient blocks in the segment are available for the write request, determining a further segment in the memory with sufficient available blocks; and writing at least a part of compressed data specified in the write request into one or more blocks in the further segment.

8. The method according to claim 6, wherein infrequently accessed data is migrated to a compressed memory, while frequently accessed data is migrated to an uncompressed memory, and the uncompressed memory and the compressed memory share a same address space accessible from a processor.

9. A memory device, comprising:

a memory chip; and a memory controller configured to perform acts comprising:

receiving from a processor a read request for reading data from the memory chip, the memory chip being divided into a plurality of segments, one of the plurality of segments being divided into a plurality of sub-segments, one of the plurality of sub-segments being compressed into one or more blocks, and the read request is for reading data from a sub-segment of a segment in the memory;

determining, in the segment, an entry corresponding to the sub-segment based on an interleaved mapping rule that uses last bits of a paragraph address as an index of the entry to ensure successive paragraphs are widely distributed, the entry comprising an indicator; and determining two or more blocks storing compressed data that contains the requested data identified in the read request based on the indicator in the entry, wherein the indicator comprises a plurality of pointers, and wherein a maximum number of pointers in the entry is determined based on a first ratio between a size of one sub-segment and a size of one block, and a size of one pointer in the entry is determined based on a second ratio between a size of one segment and a size of one block; and accessing the determined block to retrieve the compressed data, decompressing the compressed data, and providing the decompressed data to the processor in response to the read request.

10. The memory device according to claim 9, wherein the determining, in the segment, an entry corresponding to the sub-segment comprises:

the interleaved mapping rule comprising static mappings within the segment between sub-segments and entries.

11. The memory device according to claim 9, wherein a size of one sub-segment is preset to be at least eight times that of one block.

12. The memory device according to claim 9, the acts further comprising:

in response to determining two or more blocks storing compressed data that contains the requested data identified in the read request, reading the compressed data from the two or more blocks in parallel; and decompressing the compressed data to generate decompressed data.

* * * * *